US011283214B1

(12) United States Patent
Lau et al.

(10) Patent No.: US 11,283,214 B1
(45) Date of Patent: Mar. 22, 2022

(54) DIGITAL ARC-LESS CONNECTOR

(71) Applicant: Hong Kong Applied Science And Technology Research Institute Co., Ltd., Shatin (HK)

(72) Inventors: Chung Yin Lau, TSeung Kwan O (HK); Kin Lap Wong, Ngau Chi Wan (HK); Tin Ho Li, Diamond Hill (HK)

(73) Assignee: Hong Kong Applied Science and Technology Research Institute Co., LTD, Shatin (HK)

( * ) Notice: Subject to any disclaimer, the term of this patent is extended or adjusted under 35 U.S.C. 154(b) by 0 days.

(21) Appl. No.: 17/172,441

(22) Filed: Feb. 10, 2021

(51) Int. Cl.
*H01R 13/53* (2006.01)
*H01R 13/703* (2006.01)
*H01R 13/66* (2006.01)

(52) U.S. Cl.
CPC ......... *H01R 13/53* (2013.01); *H01R 13/6683* (2013.01); *H01R 13/7036* (2013.01)

(58) Field of Classification Search
CPC . H01R 13/53; H01R 13/7036; H01R 13/6683
USPC ............................................. 439/188; 307/85
See application file for complete search history.

(56) References Cited

U.S. PATENT DOCUMENTS

| | | | | |
|---|---|---|---|---|
| 4,153,870 A | * | 5/1979 | Sidman | H03K 17/79 323/319 |
| 4,853,823 A | * | 8/1989 | Arechavaleta | H01R 13/7038 361/100 |
| 4,927,382 A | * | 5/1990 | Huber | H01R 13/641 340/687 |
| 5,244,409 A | * | 9/1993 | Guss, III | H01R 13/6691 439/490 |
| 6,984,141 B1 | * | 1/2006 | Beski, Sr | H01R 13/7035 439/188 |

(Continued)

FOREIGN PATENT DOCUMENTS

| | | |
|---|---|---|
| CN | 2534694 Y | 2/2003 |
| CN | 206004091 U | 3/2017 |

(Continued)

*Primary Examiner* — Gary F Paumen
(74) *Attorney, Agent, or Firm* — GableGotwals

(57) ABSTRACT

Described is a power connector device for separating an electrical connection under direct current (DC) voltage or alternating current (AC) voltage between an electrical connector element and an electrical contact element. The power connector device includes the electrical contact element. The electrical contact element has a first conductive part and a second conductive part spaced apart one from the other so as not to be directly electrically conductively connected to one another. The power connector device includes a semiconductor switch for maintaining an electrical connection between the electrical connector element and the electrical contact element during separation of contact between said electrical connector element and said first conductive part to thereby prevent arcing during electrical disengagement of the electrical connector element from the electrical contact element. The first conductive part of the electrical contact element is only electrically connected to the second conductive part of the electrical contact element when the semiconductor switch is activated or when the electrical connector element is in contact with both the first and second conductive parts of the electrical contact element.

20 Claims, 12 Drawing Sheets

(56) References Cited

U.S. PATENT DOCUMENTS

| | | | | |
|---|---|---|---|---|
| 7,355,300 B2* | 4/2008 | Wilmot | ................ | F02P 15/003 |
| | | | | 257/E29.216 |
| 2013/0063051 A1* | 3/2013 | Sterling | ................. | B25F 5/021 |
| | | | | 315/360 |
| 2013/0127261 A1* | 5/2013 | Kagawa | .............. | H01L 29/2003 |
| | | | | 307/125 |
| 2018/0123296 A1 | 5/2018 | Brodsky et al. | | |
| 2020/0045794 A1* | 2/2020 | Reed | ........................ | H01H 9/54 |
| 2020/0112111 A1* | 4/2020 | Truessel | ............... | H01R 12/585 |

FOREIGN PATENT DOCUMENTS

| | | | |
|---|---|---|---|
| CN | 106887770 | A | 6/2017 |
| CN | 211428504 | U | 9/2020 |
| DE | 102012008614 | A1 | 10/2013 |
| EP | 3076493 | | 5/2016 |
| JP | 2016157603 | A | 9/2016 |

\* cited by examiner

DIGITAL ARC-LESS CONNECTOR

FIELD OF THE INVENTION

The invention relates to a digital arc-less connector system or device for preventing arcing or sparking during electrical disconnection between an electrical connector element and an electrical contact element.

BACKGROUND OF THE INVENTION

When unplugging a loaded electrical device or system from a power supply, arcing may occur between electrically conductive connectors/contacts being separated during the unplugging action which is undesirable as it may damage the connectors/contacts and may lead to other more serious consequences such as fires and explosions. The problem of arcing is more acute with high-power and, more particularly, with high-voltage power supplies. It is, therefore, highly desirable to prevent or at least reduce the possibility of arcing. The problem is of greater concern with direct current (DC) power supplies as, in contrast to alternating current (AC) power supplies, DC power supplies have no zero voltage crossover points.

Conventional DC electrical sockets used in DC power distribution systems are typically of complex construction, of large size, heavy in weight, inconvenient to install and expensive to purchase. Consequently, these drawbacks reduce the suitability of such DC sockets for office and residential use which, in turn, reduces the use of DC power distribution systems in such environments. Furthermore, most conventional DC sockets and DC plugs have no arc prevention or extinguishing systems.

EP3076493 discloses a sparkless socket including a sensing module, a controller, a switching module, a pressing stick and a mechanical switch. The sensing module includes an emitter and a receiver. The receiver receives an infrared light emitted by the emitter through a light guide element module and holes on slots of the socket and generates a sensing result accordingly. The pressing stick is pressed by a plug if the plug is plugged into the socket. The mechanical switch is controlled by the pressing stick to generate a first signal. The switching module is controlled by the controller to transmit AC power provided by a mains power system from the controller to the socket. The controller determines whether the plug is plugged into the socket according to the sensing result and the first signal and thereby enables or disables the switching module. The sparkless socket requires two active switch paths to prevent or reduce arcing.

DE102012008614 discloses an electrical connector for safe separation of electrical currents under DC voltage in power grids. The electrical connector uses the line voltage to turn on or off a MOSFET switch, but the electrical connector cannot operate if the line voltage falls below a specified level. Furthermore, the electrical connector must have at least three electrically conductive pins, one of which comprises an auxiliary pin which acts as a trigger pin.

What is therefore desired is an improved socket and/or plug with a self-contained arc prevention or extinguishing system of simple construction, higher reliability and less expensive to produce.

OBJECTS OF THE INVENTION

An object of the invention is to mitigate or obviate to some degree one or more problems associated with known socket and/or plug with self-contained arc prevention or extinguishing systems.

The above object is met by the combination of features of the main claims; the sub-claims disclose further advantageous embodiments of the invention.

Another object of the invention is to provide an improved socket and/or plug with a self-contained arc prevention or extinguishing system.

One skilled in the art will derive from the following description other objects of the invention. Therefore, the foregoing statements of object are not exhaustive and serve merely to illustrate some of the many objects of the present invention.

SUMMARY OF THE INVENTION

The invention relates to an electrical socket and/or plug with a self-contained arc prevention or extinguishing system which uses only one active semiconductor switching path to provide arc-less disconnection of the plug from the socket. This reduces the number of semiconductor components required thereby increasing its reliability and reducing its cost.

In a first main aspect, the invention provides a power connector device for separating an electrical connection under direct current (DC) voltage or alternating current (AC) voltage between an electrical connector element and an electrical contact element. The electrical contact element has a first conductive part and a second conductive part spaced apart one from the other. The power connector device includes a semiconductor switch for maintaining an electrical connection between the electrical connector element and the electrical contact element during separation of contact between said electrical connector element and said first conductive part to thereby prevent arcing during electrical disengagement of the electrical connector element from the electrical contact element. In this moment, the electrical connector element is moved out of contact with the first conductive part of the electrical contact element and is only in contact with the second conductive part of the electrical contact element, the first conductive part of the electrical contact element is only electrically connected to the second conductive part of the electrical contact element when the semiconductor switch is activated or when the electrical connector element is in contact with both the first and second conductive parts of the electrical contact element The power connector device may also include a trigger device for de-activating the semiconductor switch after the electrical connector has come out of contact with the first conductive part.

Optionally, the trigger device de-activates the semiconductor switch after the electrical connector element has come out of contact with the first conductive part but before the electrical connector element has come out of contact with the second conductive part.

A controller may be provided to control operation of the semiconductor switch in response to an input from the trigger device.

In a second main aspect, the invention provides an electrical socket configured for separating an electrical connection under DC voltage or AC voltage between an electrically conductive pin and an electrically conductive slot, said electrical socket comprising: said electrically conductive slot which is adapted to receive said electrically conductive pin, said electrically conductive slot having a first conductive part and a second conductive part electrically spaced apart one from the other; a semiconductor switch for maintaining an electrical connection between said electrically conductive pin and said electrically conductive slot during separation of contact between the electrically conductive pin and the first conductive part; and a trigger device for de-activating the semiconductor switch after the electrically conductive pin has come out of contact with the first conductive part but preferably before the electrically conductive pin comes out of contact with the second conductive part to thereby prevent arcing during electrical disengagement of the electrically conductive pin from the electrically conductive slot. The first conductive part of the electrically conductive slot is only electrically connected to the second conductive part of the electrically conductive slot when the semiconductor switch is activated or when the electrically conductive pin is in contact with both the first and second conductive parts of the electrically conductive slot.

In a third main aspect, the invention provides an electrical plug for separating an electrical connection under DC voltage or AC voltage between an electrically conductive pin and an electrically conductive slot, said electrical plug comprising: said electrically conductive pin which is adapted to be received in said electrically conductive slot, said electrically conductive pin having a first conductive part and a second conductive part spaced apart one from the other; a semiconductor switch for maintaining an electrical connection between said electrically conductive slot and said electrically conductive pin during separation of contact between the electrically conductive slot and the first conductive part; and a trigger device for de-activating the semiconductor switch after the electrically conductive slot has come out of contact with the first conductive part but preferably before the electrically conductive slot comes out of contact with the second conductive part to thereby prevent arcing during electrical disengagement of the electrically conductive slot from the electrically conductive pin. The first conductive part of the electrically conductive pin is only electrically connected to the second conductive part of the electrically conductive pin when the semiconductor switch is activated or when the electrically conductive slot is in contact with both the first and second conductive parts of the electrically conductive pin.

The summary of the invention does not necessarily disclose all the features essential for defining the invention; the invention may reside in a sub-combination of the disclosed features.

The forgoing has outlined fairly broadly the features of the present invention in order that the detailed description of the invention which follows may be better understood. Additional features and advantages of the invention will be described hereinafter which form the subject of the claims of the invention. It will be appreciated by those skilled in the art that the conception and specific embodiment disclosed may be readily utilized as a basis for modifying or designing other structures for carrying out the same purposes of the invention.

BRIEF DESCRIPTION OF THE DRAWINGS

The foregoing and further features of the present invention will be apparent from the following description of preferred embodiments which are provided by way of example only in connection with the accompanying figures, of which.

DESCRIPTION OF PREFERRED EMBODIMENTS

Figure 1:
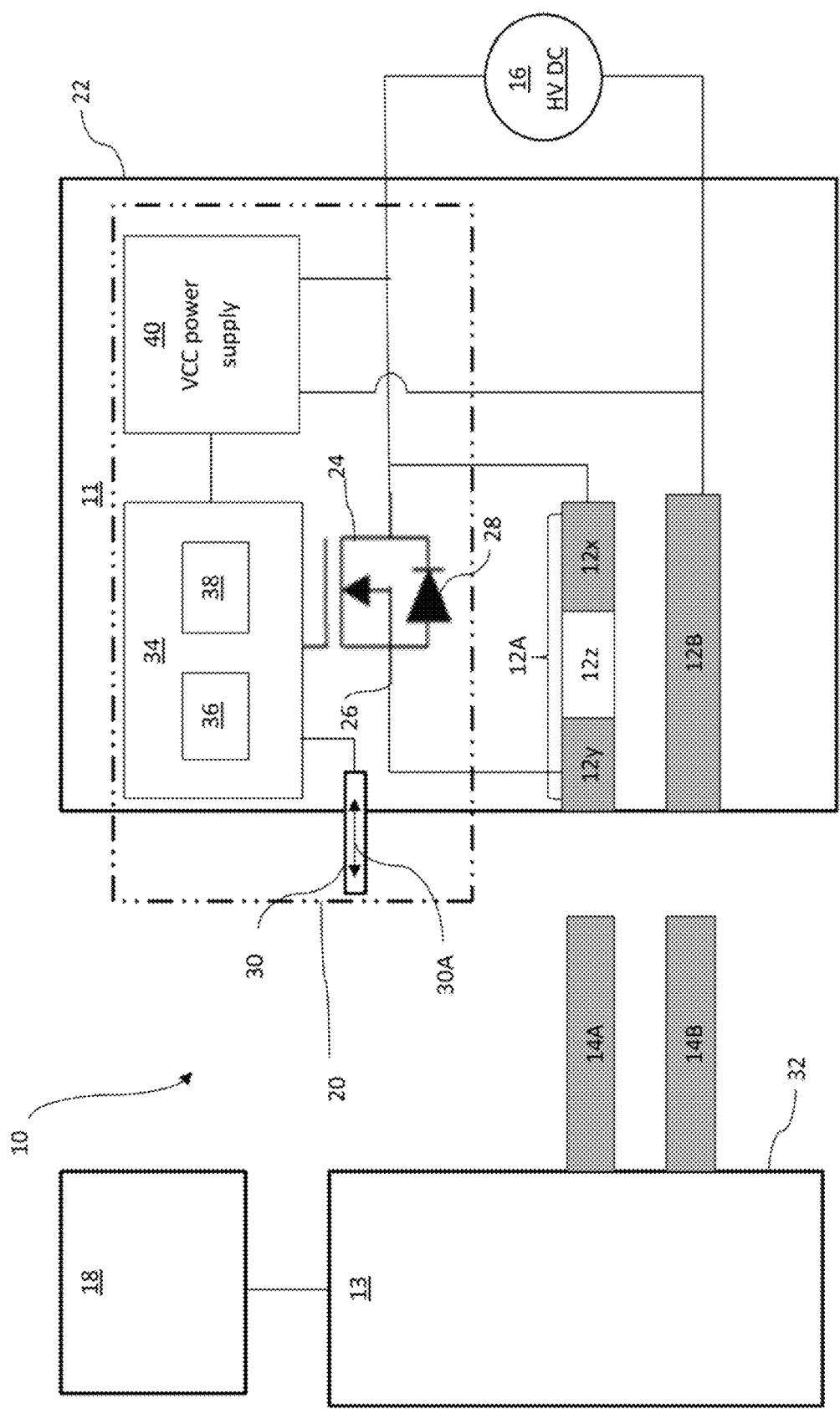
FIG. 1 is a schematic diagram of a first embodiment of a power connector device according to the invention.

The following description is of preferred embodiments by way of example only and without limitation to the combination of features necessary for carrying the invention into effect.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments, but not other embodiments.

It should be understood that the elements shown in the FIGS, may be implemented in various forms of hardware, software or combinations thereof. These elements may be implemented in a combination of hardware and software on one or more appropriately programmed general-purpose devices, which may include a processor, and input/output interfaces.

The present description illustrates the principles of the present invention. It will thus be appreciated that those skilled in the art will be able to devise various arrangements that, although not explicitly described or shown herein, embody the principles of the invention and are included within its spirit and scope.

Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of systems and devices embodying the principles of the invention.

The functions of the various elements shown in the figures may be provided through the use of dedicated hardware as well as hardware capable of executing software in association with appropriate software.

In the claims hereof, any element expressed as a means for performing a specified function is intended to encompass any way of performing that function including, for example, a) a combination of circuit elements that performs that function or b) software in any form, including, therefore, firmware, microcode or the like, combined with appropriate circuitry for executing that software to perform the function. The invention as defined by such claims resides in the fact that the functionalities provided by the various recited means are combined and brought together in the manner which the claims call for. It is thus regarded that any means that can provide those functionalities are equivalent to those shown herein.

Referring to the drawings, FIG. 1 is a schematic diagram illustrating a first embodiment of a power connector system 10 in accordance with the invention. The power connector system 10 comprises a first connector device 11 which, in use, engages in an electrical connection with a second connector device 13 to provide electrical power from a power supply 16 to a device or system 18 requiring electrical power to operate.

In the embodiment of FIG. 1, the first connector device 11 may be permanently electrically connected to the power supply 16 and/or the power supply 16 may form part of the first connector device 11. Alternatively, the power supply 16 may be a mains or battery power supply to which the first connector device 11 is electrically connected to as and when required. The first connector device 11 may comprise an electric socket although this is not essential for implementation of the invention.

The power supply 16 is shown as comprising a high-voltage (HV) direct current (DC) power supply 16, but this is also not essential for the implementation of the invention as embodiments of the invention may involve other types of power supply including alternating current (AC) power supplies.

The second connector device 13 may be permanently electrically connected to the device or system 18, or second connector device 13 may form part of the device or system 18. In some embodiments, the second connector device 13 may comprise an electric plug although this is not essential for implementation of the invention.

In this embodiment, the second connector device 13 may comprise a conventional electric plug without any modifications required or necessary for implementation of the present invention, although in some embodiments, the second connector 13 may include modifications to enhance implementation of the invention. Such modifications may include a trigger means adapted to cooperate with a trigger device 30 of the first connector device 11. The second connector device 13 has at least two electrically conductive pins 14A, B although it should be understood that, in accordance with the present invention, the second connector device 13 requires no more than two electrically conductive pins to implement the invention. A first one 14A of the pins 14A, B comprises an electrically active pin 14A or a power pin 14A. The electrically active pin 14A provides at least one electrical connector element for contacting at least one electrical contact element of the first connector device 11. A second one 14B of the pins 14A, B comprises a power return or neutral pin 14B.

The at least one electrical contact element of the first connector device 11 may comprise a first electrically conductive slot 12A adapted to receive the electrical connector element comprising the electrically active pin 14A. The first connector device 11 includes a second electrically conductive slot 12B comprising a power return or neutral slot 12B for receiving the power return pin 14B of the second connector device 13. The power supply 16 connects across at least the first and second electrically conductive slots 12A, B.

The first connector device 11 has associated therewith an arc prevention or extinguishing system 20 denoted by dashed line box 20 in FIG. 1. The arc prevention or extinguishing system 20 is provided to prevent arcing or sparking when the first connector device 11 and the second connector device 13 are electrically separated, i.e., electrically disengaged from one another. In this embodiment, electrical separation may comprise removing the electrical plug comprising the second connector device 13 from the electrical socket comprising the first connector device 11. This comprises withdrawing the pins 14A, B of the second connector device 13 fully from the slots 12A, B of the first connector device 11.

The arc prevention or extinguishing system 20 associated with the first connector device 11 may be contained within a housing 22 of the first connector device 11 or it may comprise a separate device electrically connectable thereto.

The arc prevention or extinguishing system 20 preferably comprises a semiconductor switch 24 for maintaining an electrical connection between said electrical connector element comprising the active pin 14A of the second connector device 13 with the electrical contact element comprising the first electrically conductive slot 12A of the first connector device 11 during separation of contact between said active pin 14A and said first electrically conductive slot 12A. More specifically, the first electrically conductive slot 12A has a first conductive part 12$x$ and a second conductive part 12$y$ spaced apart one from the other. The space between the first conductive part 12$x$ and the second conductive part 12$y$ may be provided by an electrically insulating slot section 12$z$ bridging or spanning a separation gap between the first and second conductive slot parts 12$x$, $y$. The insulating slot section 12$z$ may be integral with the housing 22 of the first connector device 11 or it may comprise a separate electrically insulating component fixed in the separation gap. The arrangement is such that the first conductive part 12$x$ is not directly conductively connected to the second conductive part 12$y$ except when the electrically active pin 14A is in contact with both the first and second conductive slot parts 12$x$, $y$ of the first electrically conductive slot 12A. The first conductive part 12$x$ is also only electrically/conductively connected to the second conductive part 12$y$ when the semiconductor switch 24 is activated to turn on a semiconductor switch path 26 bridging or spanning the separation gap between the first and second conductive slot parts 12$x$, $y$ and thereby indirectly conductively connecting the first and second conductive slot parts 12$x$, $y$ when the semiconductor switch 24 is activated.

The semiconductor switch 24 is configured to maintain the electrical connection between the active pin 14A of the second connector device 13 with the first part 12$x$ of the first electrically conductive slot 12A of the first connector device 11 during separation of physical contact between said active pin 14A and the first part 12$x$ of the first electrically conductive slot 12A. This may be achieved by the semiconductor switch 24 opening the semiconductor switch path 26 between or electrically bridging the first and second parts 12$x$, $y$ of the first electrically conductive slot 12A, said semiconductor switch path 26 by-passing the insulating slot section 12$z$. Consequently, even after the active pin 14A has physically separated from contact with the first part 12$x$ of the first electrically conductive slot 12A, a power connection is still maintained between the first part 12$x$ of the first electrically conductive slot 12A and the active pin 14A via the semiconductor switch path 26 and the second part 12y of the first electrically conductive slot 12A which continues to be in physical and electrical contact with the active pin 14A until further withdrawn therefrom. One advantage of the foregoing is that this prevents arcing or sparking when the active pin 14A comes out of physical contact with the first part 12x of the first electrically conductive slot 12A as there will be no potential difference between the active pin 14A and the first part 12x of the first electrically conductive slot 12A at the point in time of physical separation from each other.

It is, however, preferable that, prior to the active pin 14A subsequently coming out of physical contact with the second part 12y of the first electrically conductive slot 12A, the semiconductor switch 24 is controlled to switch off the semiconductor switch path 26. This removes any electrical potential difference between the first and second electrically conductive slots 12A,B of the first connector device 11 and any applied electrical potential difference between the active pin 14A and the power return pin 14B of the second connector device 13 to thereby prevent arcing when the active pin 14A comes out of physical contact with the second part 12y of the first electrically conductive slot 12A, i.e., when the second connector device 13 is physically and electrically separated from the first connector device 11.

The semiconductor switch 24 preferably comprises a semiconductor switch 24 bridging or spanning the separation gap between the first and second conductive slot parts 12x, y. The semiconductor switch 24 may be a common collector type semiconductor switch. The semiconductor switch 24 may have a body diode 28 connected in parallel with the semiconductor switch path 26. The body diode 28 is an intrinsic diode which depends on which type of semiconductor switch (e.g., MOSFET) is used as the semiconductor switch 24.

The arc prevention or extinguishing system 20 may include a trigger device 30 for activating and de-activating the semiconductor switch 24. In some embodiments, the trigger device 30 may comprise an optical device which senses a separation distance between, for example, opposing faces of the housing 22 of the first connector device 11 and a housing 32 of the second connector device 13. In other embodiments, the trigger device 30 may comprise a proximity detector device which detects proximity, i.e., distance of the housing 22 of the first connector device 11 to the housing 32 of the second connector device 13. The proximity detector device may be a magnetically operated proximity detector device. The trigger device may comprise a position sensor of any suitable type.

For reasons of simplicity of construction, the trigger device 30 preferably comprises a mechanically actuated device whereby the trigger device 30 is mechanically triggered or actuated by relative movement of the housing 32 of the second connector device 13 away from or towards the housing of the first connector device 11. The trigger device 30 may comprise a trigger member 30A which is biased to an "off" position such that, when the trigger member is in the "off" position, the semiconductor switch 24 is deactivated.

When the second connector device 13 is moved into engagement with the first connector device 11, the trigger member 30A is moved away from its "off" position to an "on" position. When the trigger member 30A is moved to its "on" position, the trigger device 30 provides an input signal to a controller 34 of the arc prevention or extinguishing system 20. The controller 34 comprises a processor 36 and gate driver 38. The processor 36 configures the controller 34 to implement the arc prevention or extinguishing process of the invention as described in more detail below. The controller 34 is preferably powered by a voltage common collector (VCC) power supply 40 which also powers the semiconductor switch 24. The VCC power supply 40 draws power from the main power supply 16.

The controller 34 processes the input from the trigger device 30 to determine if there is a separation action being implemented to separate the first connector device 11 from the second connector device 13. If such a separation action is determined, the controller 34 enables or activates the semiconductor switch 24 to make the semiconductor switch path 26 conductive. The controller 34 activates the semiconductor switch 24 before the active pin 14A has come out of contact with the first part 12x of the first slot 12A. More specifically, the controller 34 turns on the semiconductor switch 24 when the second connector device 13 is first inserted into the first connector device 11. Then, when the separation action continues to the point where the electrical connector element comprising the active pin 14A has come out of contact with at least the first conductive part 12x of the electrical contact element comprising the first slot 12A, the controller 34 disables or deactivates the semiconductor switch 24 to turn off the semiconductor switch path 26. The determination of when the separation action continues to the point where the active pin 14A has come out of contact with at least the first part 12x of the first slot 12A may be based on the controller 34 determining that the trigger member 30A of the trigger device 30 is no longer in its "on" position and/or has returned to its "off" position. Thus, the trigger device 30 may cause de-activation of the semiconductor switch 24 after the active pin 14A has come out of contact with the first part 12x of the first slot 12A but preferably before the active pin 14A has come out of contact with the second part 12y of the first slot 12A.

The body diode 28 prevents current conduction via the semiconductor switch path 26 when the semiconductor switch 24 is deactivated.

The trigger device 30 in concert with the controller 34 activates the semiconductor switch 24 at least before the active pin 14A has come out of contact with the first part 12x of the first slot 12A and deactivates the semiconductor switch 24 after the active pin 14A has come out of contact with the first part 12x of the first slot 12A.

It can be seen in the power connector device 10 of FIG. 1 that the semiconductor switch 24 comprises or provides a single active semiconductor switch path 26 for preventing arcing when the first and second connector devices 11, 13 are drawn apart from each other.

It can also be seen in the power connector device 10 of FIG. 1 that the first conductive part 12x and the second conductive part 12y of the first conductive slot 12A are spaced apart in a separation direction of the active pin 14A with the first slot 12A.

The power connector device 10 of FIG. 1 may comprise a combination of the first connector device 11 and the second connector device 13 or just the first connector device 11. In one arrangement, this may comprise a combination of an electric plug and an electric socket, each suitably modified in accordance with the invention. In the latter case, where the first connector device 11 comprises a power connector device according to the invention in the form of a modified electric socket, the modified socket can be utilized with conventional electric plugs. Similarly, where the first connector device 11 comprises a power connector device according to the invention in the form of a modified electric plug, the modified plug can be utilized with conventional electric sockets.

Figure 2:
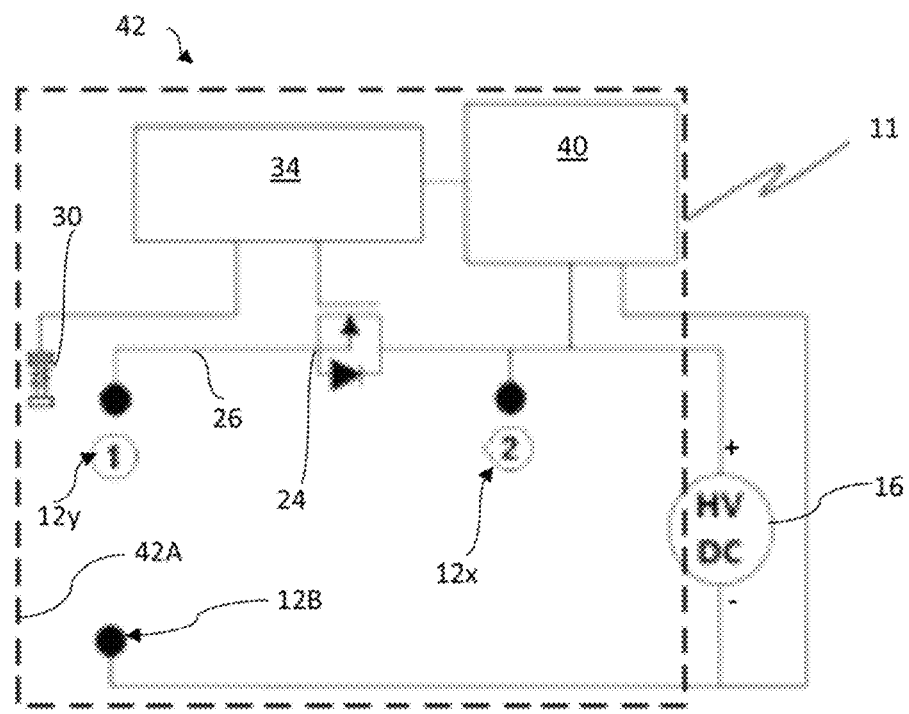
FIG. 2 is a block diagram of a control and power circuit for the power connector device of FIG. 1.

FIG. 2 provides a block diagram of a control and power circuit 42 for the power connector device 10 of FIG. 1 in which those parts of the illustrated circuit 42 within the dashed box 42A are preferably self-contained in the housing 22 of the first connector device 11.

Figure 3:
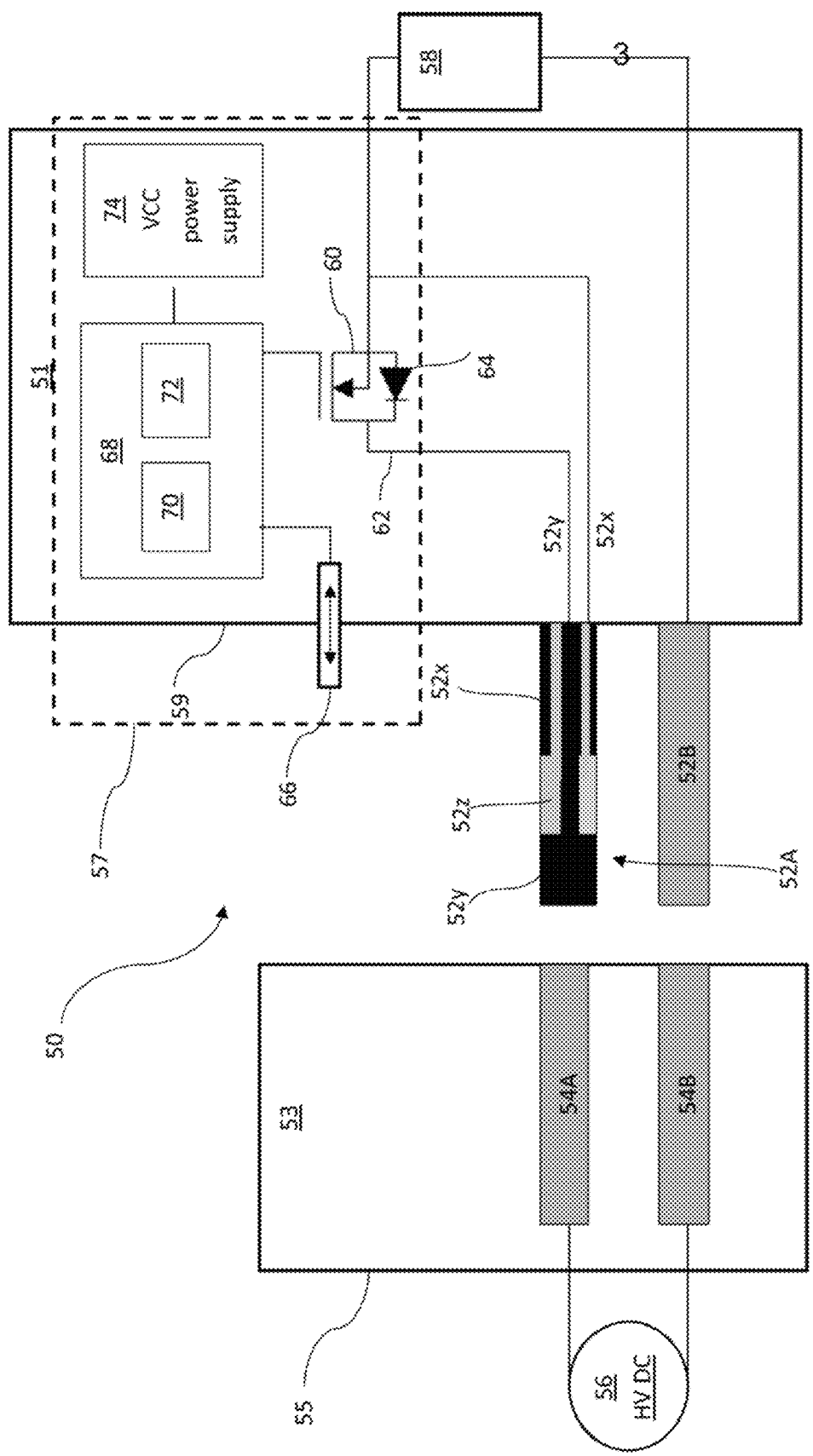
FIG. 3 is a schematic diagram of a second embodiment of a power connector device according to the invention.

FIG. 3 is a schematic diagram illustrating a second embodiment of a power connector system 50 in accordance with the invention. The power connector system 50 comprises a first connector device 51 which, in use, engages in an electrical connection with a second connector device 54 to provide electrical power from a power supply 56 to a device or system 58 requiring electrical power to operate.

In this embodiment, which has some similarities to the first embodiment of FIG. 1, a main power supply 56 is connected to the second connector device 54 which may comprise a conventional electric socket preferably without any modifications necessary for implementation of the present invention. The second connector device 54 has at least first and second conductive slots 54A, B for receiving corresponding first and second electrically conductive pins 52A, B of the first connector device 51. The first connector device 51 may comprise a modified electric plug.

The first connector device 51 has at least two electrically conductive pins 52A, B although it should be understood that, in accordance with the present invention, the first connector device 51 requires no more than two electrically conductive pins to implement the invention.

A first one 52A of the pins 52A, B comprises an electrically active pin 52A or a power pin 52A. The electrically active pin 52A provides an electrical contact element for contacting an electrical connector element, e.g., first conductive slot 54A, of the second connector device 54. A second one 52B of the pins 52A, B comprises a power return or neutral pin 52B.

The electrical contact element of the first connector device 51 comprising the first electrically conductive pin 52A is adapted to be received, in use, in the electrical connector element comprising the first conductive slot 54A of the second connector device. The device or system 58 which requires power to operate can be considered as comprising a load and is connected across the first and second electrically conductive pins 52A, B.

The first electrically conductive pin 52A comprises a modified pin having a first conductive part 52$x$ and a second conductive part 52$y$ spaced apart one from the other. This may be achieved by arranging the first and second conductive parts 52$x$, $y$ concentrically and separated by a concentrically arranged insulator member 52$z$. More specifically, the first conductive part 52$x$ of the first electrically conductive pin 52A may comprise a cylindrical member which surrounds but is electrically insulated from a rearward shaft portion of the second conductive part 52$y$. The second conductive part 52$y$ may include an expanded head portion. The insulator member 52$z$ is arranged to also surround the rearward shaft portion of the second conductive part 52$y$ and to extend along said shaft portion such that an outer surface of the first electrically conductive pin 52A has three contact regions provided respectively by the first conductive part 52$x$, the insulator member 52$z$, and the second conductive part 52$y$.

The first connector device 51 has an arc prevention or extinguishing system denoted by dashed box 57 in FIG. 3 which is provided to prevent arcing or sparking when the first connector device 51 and the second connector device 54 are electrically separated, i.e., electrically disengaged from one another. In this embodiment, electrical separation may comprise removing the electrical plug comprising the first connector device 51 from the electrical socket comprising the second connector device 54. This comprises withdrawing the pins 52A, B of the first connector device 51 fully from the slots 54A, B of the second connector device 54.

The arc prevention or extinguishing system 57 may be contained within a housing 59 of the first connector device 51 or it may comprise a separate device electrically connectable thereto.

The arc prevention or extinguishing system 57 preferably comprises a semiconductor switch 60 for maintaining an electrical connection between said electrical connector element comprising the first conductive slot 54A of the second connector device 54 with the electrical contact element comprising the first electrically conductive pin 52A of the first connector device 51 during separation of contact between said first conductive slot 54A and said first electrically conductive pin 52A.

The semiconductor switch 60 is configured to maintain the electrical connection between the first conductive slot 54A of the second connector device 54 with the first electrically conductive pin 52A during separation of physical contact between said first conductive slot 54A and the first part 52$x$ of the first electrically conductive pin 52A. This may be achieved by the semiconductor switch 60 opening a semiconductor switch path 62 between or electrically bridging the first and second parts 52$x$, $y$ of the first electrically conductive pin 52A, said semiconductor switch path 62 by-passing the insulating slot section 52$z$. Consequently, even after the first conductive slot 54A has physically separated from contact with the first part 52$x$ of the first electrically conductive pin 52A, a power connection is still maintained between the first part 52$x$ of the first electrically conductive pin 52A and the first conductive slot 54A via the semiconductor switch path 62 and the second part 52$y$ of the first electrically conductive pin 52A which continues to be in physical and electrical contact with the first conductive slot 54A. One advantage of the foregoing is that this prevents arcing or sparking when the first conductive slot 54A comes out of physical contact with the first part 52$x$ of the first electrically conductive pin 52A as there will be no applied potential difference between the first conductive slot 54A and the first part 52$x$ of the first electrically conductive pin 52A at the point in time of physical separation from each other.

It is, however, preferable that, prior to the first conductive slot 54A subsequently coming out of physical contact with the second part 52$y$ of the first electrically conductive pin 52A, the semiconductor switch 60 is controlled to switch off the semiconductor switch path 62. This removes any electrical potential difference between the first and second electrically conductive slots 54A,B of the second connector device 54 and any applied electrical potential difference between the active pin 52A and the power return pin 52B of the first connector device 51 to thereby prevent arcing when the first conductive slot 54A comes out of physical contact with the second part 52$y$ of the first electrically conductive pin 52A, i.e., when the second connector device 54 is physically and electrically separated from the first connector device 51.

The arrangement is such that the first conductive part 52$x$ is not directly conductively connected to the second conductive part 52$y$ except when the first conductive slot 54A is in contact with both said first and second conductive parts 52$x$, $y$. The first conductive part 52$x$ is also only electrically/conductively connected to the second conductive part 52$y$ when the semiconductor switch 60 is activated to turn on the semiconductor switch path 62 bridging or spanning the separation gap between the first and second conductive pin parts 52x, y and thereby indirectly conductively connecting the first and second conductive pin parts 52x, y when the semiconductor switch 60 is activated.

As with the embodiment of FIG. 1, the semiconductor switch 60 preferably comprises a semiconductor switch 60 bridging or spanning a separation gap between the first and second conductive pin parts 52x, y. The semiconductor switch 60 may have a body diode 64 in parallel with the semiconductor switch path 62.

The arc prevention or extinguishing system 57 may include a trigger device 66 for activating and de-activating the semiconductor switch 60. The trigger device 66 preferably comprises a mechanically actuated device whereby the trigger device 66 is mechanically triggered or actuated by relative movement of a housing 55 of the second connector device 54 away from or towards the housing 59 of the first connector device 51.

When the second connector device 54 is moved into engagement with the first connector device 51, the trigger device 66 moves from an "off" condition to an "on" condition. When the trigger device 66 is in its "on" condition, the trigger device 66 provides an input signal to a controller 68 of the arc prevention or extinguishing system 57. The controller 68 comprises a processor 70 and a gate driver 72. The processor 70 configures the controller 68 to implement the arc prevention or extinguishing process of the invention as described in more detail below. The controller 68 is powered by a voltage common collector (VCC) power supply 74 which also powers the semiconductor switch 60. The VCC power supply 74 draws power from the main power supply 16 when the first connector device 51 and the second connector device 54 are electrically engaged although it may draw power from another suitable power supply.

The controller 68 processes the input from the trigger device 30 to determine if there is a separation action being implemented to separate the first connector device 51 from the second connector device 54. If such a separation action is determined, the controller 68 deactivates the semiconductor switch 60 to turn off the semiconductor switch path 62 when the separation action has reached a point where the electrical connector element comprising the first conductive slot 54A has come out of contact with at least the first part 52x of the electrical contact element comprising the first electrically conductive pin 52A. The determination of when the separation action has reached the point where the first conductive slot 54A has come out of contact with at least the first part 52x of the first electrically conductive pin 52A may be based on the controller 68 determining that the trigger device 66 is no longer in its "on" position and/or has returned to its "off" position. Thus, the trigger device 66 may cause de-activation of the semiconductor switch 60 after the first conductive slot 54A has come out of contact with the first part 52x of the first electrically conductive pin 52A and preferably before first conductive slot 54A has come out of contact with the second part 52y of the first electrically conductive pin 52A.

The body diode 64 prevents current conduction via the semiconductor switch path 62 when the semiconductor switch 60 is deactivated.

Figure 4:
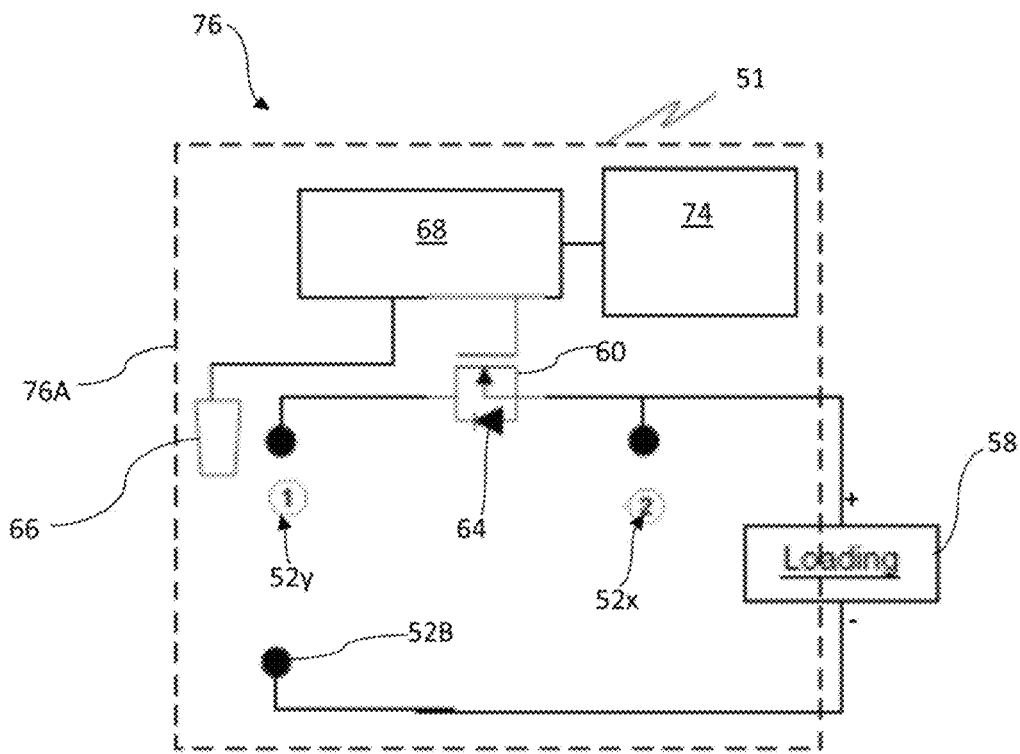
FIG. 4 is a block diagram of a control and power circuit for the power connector device of FIG. 3.

FIG. 4 provides a block diagram of a control and power circuit 76 for the power connector device 50 of FIG. 3 in which those parts of the illustrated circuit within the dashed line box 76A are preferably self-contained in the housing 59 of the first connector device 51.

The power connector device 50 of FIG. 3 may comprise a combination of the first connector device 51 and the second connector device 54 or just the first connector device 51 where no modification is necessary for the second connector device 54 which may comprise a conventional connector device.

FIGS. 5A-D illustrate a further embodiment of a connector device in accordance with the invention where the first connector device comprises a modified electric socket 111 and the second connector device comprises an electric plug 113.

In the following description of the embodiment of FIGS. 5A-D, like numerals to those used for the embodiment of FIG. 1 will be utilized to denote the same or equivalent parts but preceded by the numeral "1".

In this embodiment of the connector device 110 in accordance with the invention, the electric plug 113 is largely a conventional electric plug save for a mechanical trigger member 131 attached to its housing 132 which, in use, actuates the trigger device 130 of the socket 111.

Figure 5A:
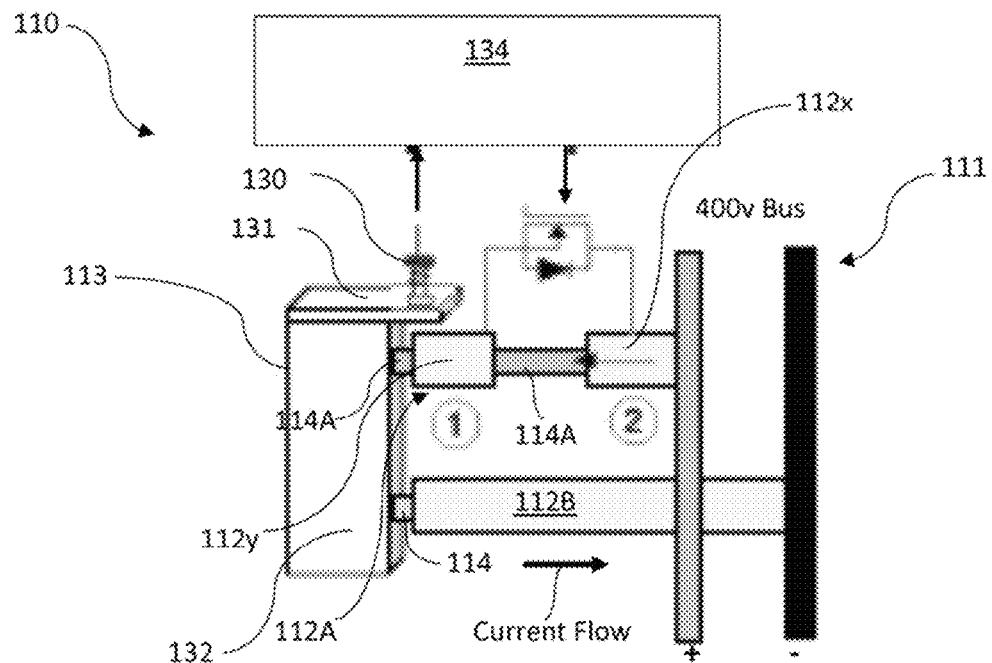
FIGS. 5A-D are schematic diagrams of a third embodiment of a power connector device according to the invention showing the mode of operation in more detail.

FIG. 5A shows the plug 113 fully physically and electrically engaged with the socket 111 such that the active pin 114A of the plug 113 is in contact with both the first and second conductive parts 112x,112y of the first conductive slot 112A. As such, current flows in a conventional manner between the slots 112A, B of the socket 111 and the pins 114A, B of the plug 113. Consequently, in this instance, the slots 112A, B of the socket 111 and the pins 114A, B of the plug 113 form the main current pathway.

It will be noted that, in FIG. 5A, the mechanical trigger member 131 of the plug 113 has mechanically actuated the trigger device 130 of the socket 111 to cause said trigger device 130 to be in its "on" position. The trigger device 130 outputs a signal to the controller 134 and may also output a signal to the controller 134 when it returns to its "off" position (FIGS. 5C & D). Alternatively, the controller 134 may itself be configured to detect that the trigger device 130 is in its "on" position and/or its "off" position.

Figure 5B:
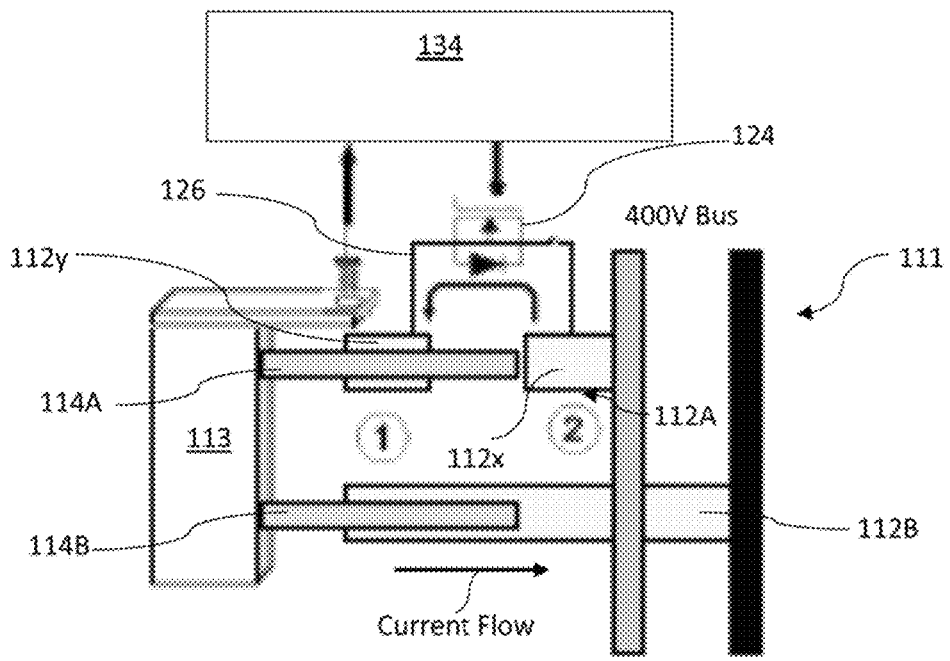
Figure 5C:
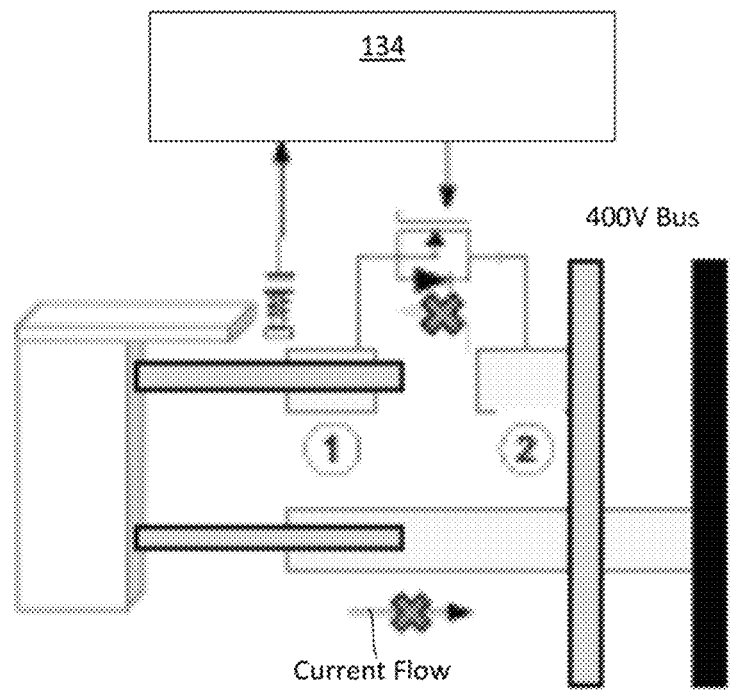

FIG. 5B illustrates the situation where a separation action is underway between the plug 113 and the socket 111. As illustrated, the plug 113 has been withdrawn from the socket 111 to an extent that the active pin 114A has just come out of contact with the first part 112x of the first slot 112A but is still in contact with the second part 112y of said first slot 112A. At some point in time prior to the active pin 114A coming out of contact with the first part 112x of the first slot 112A, the controller 134 activates the semiconductor switch 124 which has opened the semiconductor switch path 126 to maintain an electrical conduction path between the active pin 114A and the first part 112x of the first slot 112A despite the active pin 114A now being out of contact with the first part 112x of the first slot 112A. Current now flows between the between the slots 112A,B of the socket 111 and the pins 114A,B of the plug 113 via the semiconductor switch path 126. Consequently, in this situation, current flow between the slots 112A, B of the socket 111 and the pins 114A, B of the plug 113 is under the control of the controller 134.

It will be noted that, in FIG. 5B, the mechanical trigger member 131 of the plug 113 is still mechanically actuating the trigger device 130 of the socket 111.

The controller 134 may be configured to detect when a separation action is initiated in order to activate the semiconductor switch 124 prior to the active pin 114A coming out of contact with the first part 112x of the first slot 112A. Alternatively, the semiconductor switch 124 may be activated upon insertion of the plug 113 into the socket 111 and remain activated for the duration that the plug 113 remains inserted in the socket 111 such that the conductive pathway 126 conducts immediately the active pin 114A comes out of contact with the first part 112x of the first slot 112A thereby preventing arcing or sparking between the active pin 114A and the first part 112x of the first slot 112A.

FIG. 5C illustrates the situation where the plug 113 has not yet been fully withdrawn from the socket 111 such that the active pin 114A is still in contact with the second part 112y of the first slot 112A but where the plug 113 has been withdrawn by a sufficient amount where the mechanical trigger member 131 of the plug 113 no longer mechanically actuates the trigger device 130 of the socket 111. Once the mechanical trigger member 131 of the plug 113 stops actuating the trigger device 130 of the socket 111, the controller 134 may deactivate the semiconductor switch 124 which switches off the semiconductor switch path 126 to prevent current flow through the semiconductor switch path 126. The plug 113 can then be further withdrawn from the socket 111 without any danger of arcing or sparking occurring between the active pin 114A and the second part 112y of the first slot 112A as the semiconductor switch path 126 is now closed, i.e., not conducting.

Figure 5D:
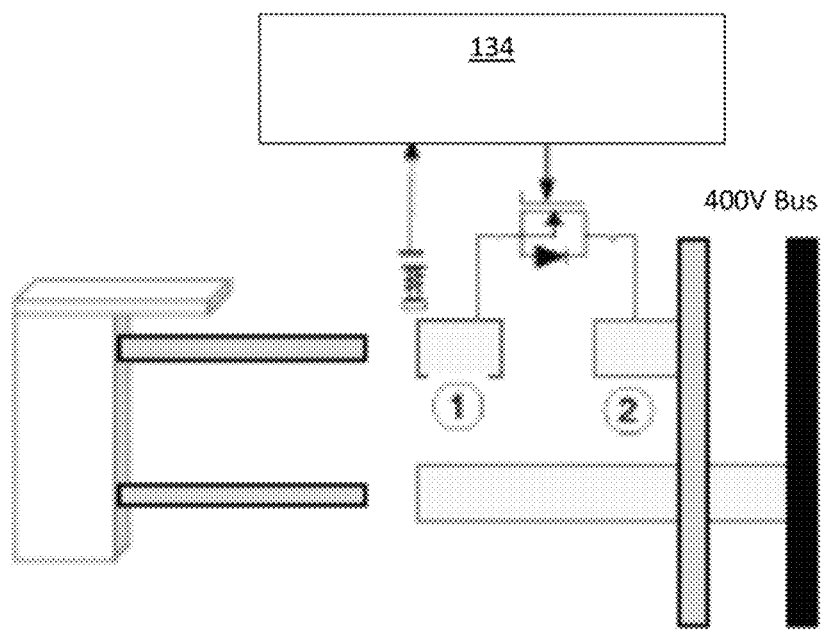

FIG. 5D illustrates the situation where the plug 113 is fully withdrawn from the socket 111.

FIGS. 6A-D illustrate a further embodiment of a connector device in accordance with the invention where the first connector device comprises a modified electric plug and the second connector device comprises an electric socket.

In the following description of the embodiment of FIGS. 6A-D, like numerals to those used for the embodiment of FIG. 3 will be utilized to denote the same or equivalent parts but preceded by the numeral "1".

In this embodiment of the connector device 150 in accordance with the invention, the electric socket 153 is largely a conventional electric socket save for a mechanical trigger member 165 provided in its housing 155 which, in use, actuates the trigger device 166 of the plug 151.

Figure 6A:
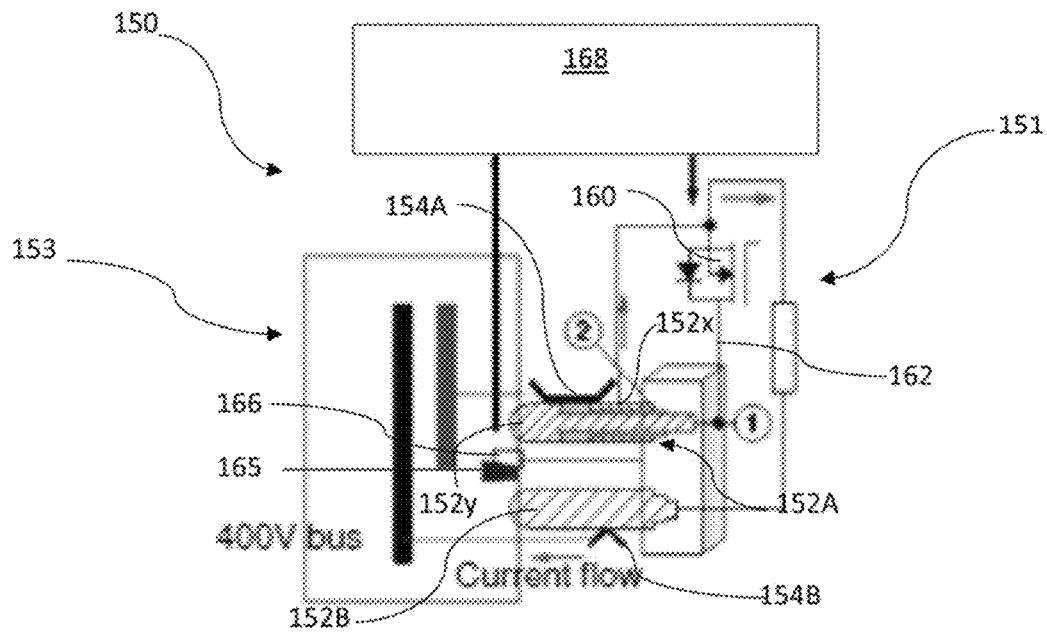
FIGS. 6A-D are schematic diagrams of a fourth embodiment of a power connector device according to the invention showing the mode of operation in more detail.

FIG. 6A shows the socket 153 fully physically and electrically engaged with the plug 151 such that the first conductive slot 154A of the socket 153 is in contact with both the first and second conductive parts 152x,152y of the active pin 152A of the plug 151. As such, current flows in a conventional manner between the pins 152A, B of the plug 151 and the slots 154A, B of the socket 153. Consequently, in this instance, the slots 154A, B of the socket 153 and the pins 152A, B of the plug 151 form the main current pathway.

It will be noted that, in FIG. 6A, the mechanical trigger member 165 of the socket 153 has mechanically actuated the trigger device 166 of the plug 151 to cause said trigger device 166 to be in its "on" position. The trigger device 166 outputs a signal to the controller 168 and may also output a signal to the controller 168 when it returns to its "off" position (FIGS. 6C & D). Alternatively, the controller 168 may itself be configured to detect that the trigger device 166 is in its "on" position and/or its "off" position.

Figure 6B:
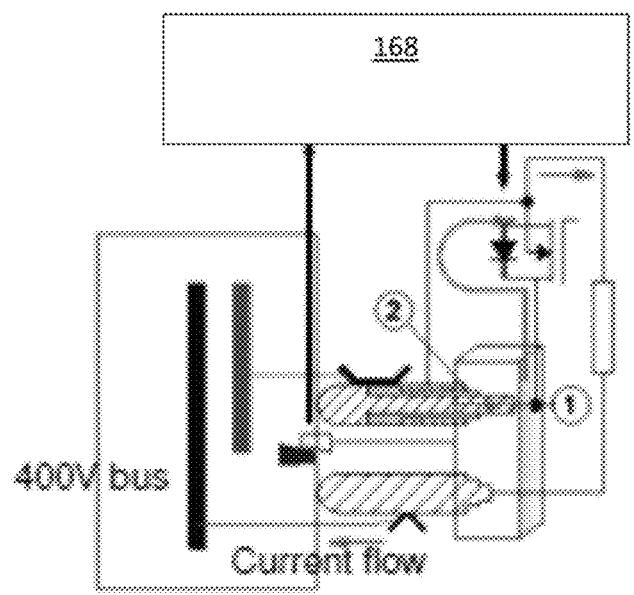
Figure 6C:
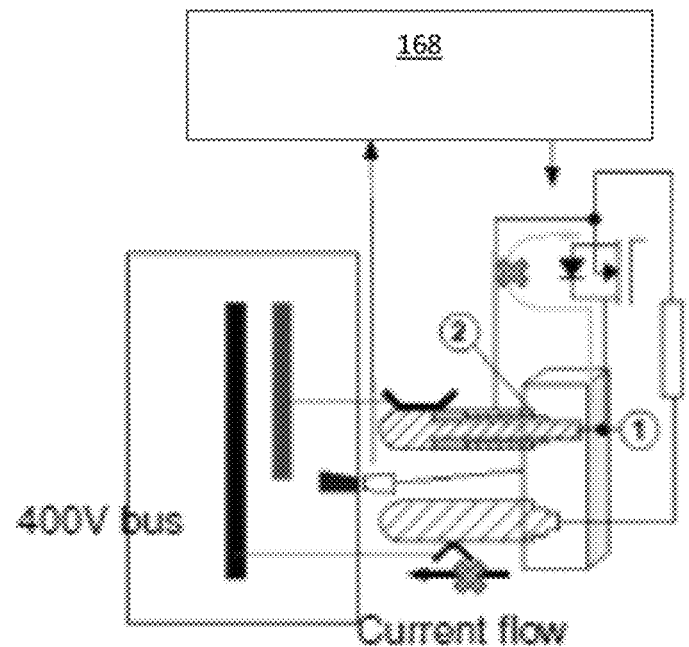

FIG. 6B illustrates the situation where a separation action is underway between the plug 151 and the socket 153. As illustrated, the plug 151 has been withdrawn from the socket 153 to an extent that the first slot 154A of the socket 153 has just come out of contact with the first part 152x of the active pin 152A of the plug 151 but is still in contact with the second part 152y of the active pin 152A. At some point in time prior to the first slot 154A coming out of contact with the first part 152x of the active pin 152A, the controller 168 activates the semiconductor switch 160 which opens the semiconductor switch path 162 to maintain an electrical conduction path between the first slot 154A and the first part 152x of the active pin 152A despite the first slot 154A now being out of contact with the first part 152x of the active pin 152A. Current now flows between the between the slots 154A,B of the socket 153 and the pins 152A,B of the plug 151 via the semiconductor switch path 162. Consequently, in this situation, current flow between the slots 154A, B of the socket 153 and the pins 152A, B of the plug 151 is under the control of the controller 168.

It will be noted that, in FIG. 6B, the mechanical trigger member 165 of the socket 153 is still mechanically actuating the trigger device 166 of the plug 151.

The controller 168 may be configured to detect when a separation action is initiated in order to activate the semiconductor switch 160 prior to the first slot 154A coming out of contact with the first part 152x of the active pin 152A. Alternatively, the semiconductor switch 160 may be activated upon insertion of the plug 151 into the socket 153 and remain activated for the duration that the plug 151 remains inserted in the socket 153 such that the conductive pathway 162 conducts immediately the first slot 154A comes out of contact with the first part 152x of the active pin 152A thereby preventing arcing or sparking between the first part 152x of the active pin 152A and the first slot 154A.

FIG. 6C illustrates the situation where the plug 151 has not yet been fully withdrawn from the socket 153 such that the first slot 154A is still in contact with the second part 152y of the active pin 152A but where the plug 151 has been withdrawn by a sufficient amount where the mechanical trigger member 165 of the socket 153 no longer mechanically actuates the trigger device 166 of the plug 151. Once the mechanical trigger member 165 of the socket 153 stops actuating the trigger device 166 of the plug 151, the controller 168 may deactivate the semiconductor switch 160 which switches off the semiconductor switch path 162 to prevent current flow through the semiconductor switch path 162. The plug 151 can then be further withdrawn from the socket 153 without any danger of arcing or sparking occurring between the first slot 154A and the second part 152y of the active pin 152A as the semiconductor switch path 162 is now closed, i.e., not conducting.

Figure 6D:
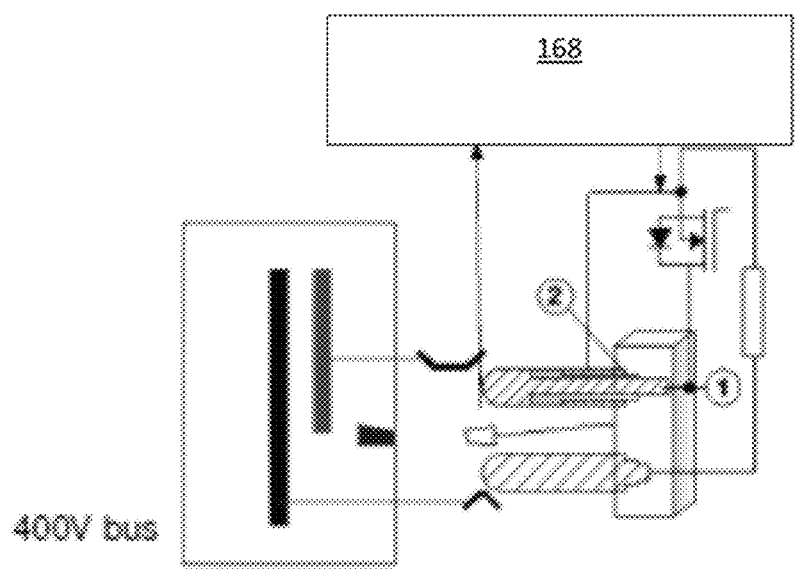

FIG. 6D illustrates the situation where the plug 151 is fully withdrawn from the socket 153.

Referring again to the first embodiment of the invention depicted by FIG. 1, FIG. 2 provides a block diagram of the control and power circuit 42 for the power connector device 10 of FIG. 1. The control and power circuit 42 of FIG. 2 is also applicable to the power connector device 110 of the third embodiment of the invention depicted by FIGS. 5A-D. FIGS. 7A-E provide alternative control and power circuits to that of FIG. 2 for the power connector device 10 of the first embodiment and the power connector device 110 of the third embodiment.

Figure 7A:
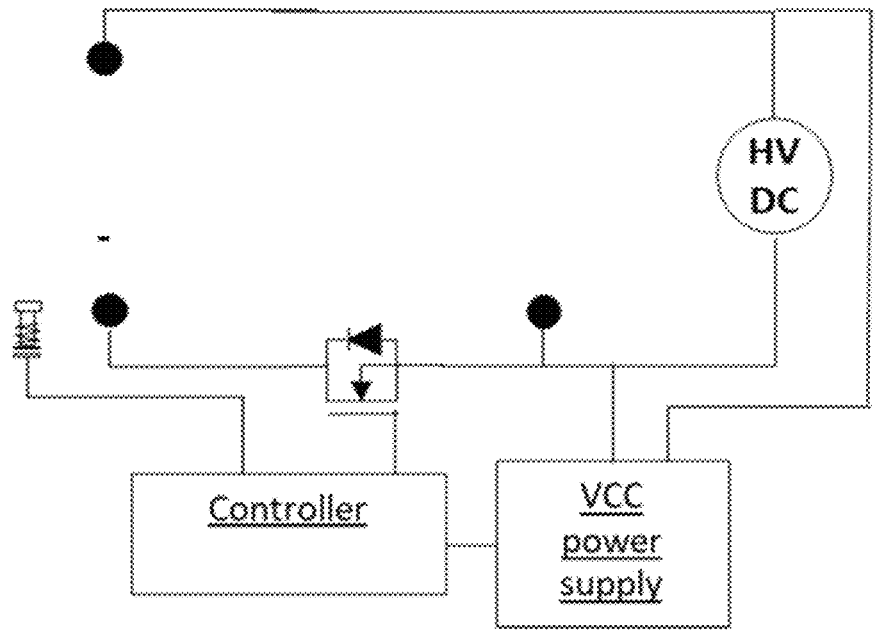
FIGS. 7A-E are alternative control and power circuits to that of FIG. 2 for the power connector device of the first and third embodiments of FIGS. 1 and 5A-D.

The control and power circuit of FIG. 7A is applicable to the power connector device 10, 110 still utilizing a DC power supply but for another pole line of said DC power supply. As such, the control and power circuit of FIG. 7A is to some degree a mirror image of the control and power circuit 42 of FIG. 2.

Figure 7B:
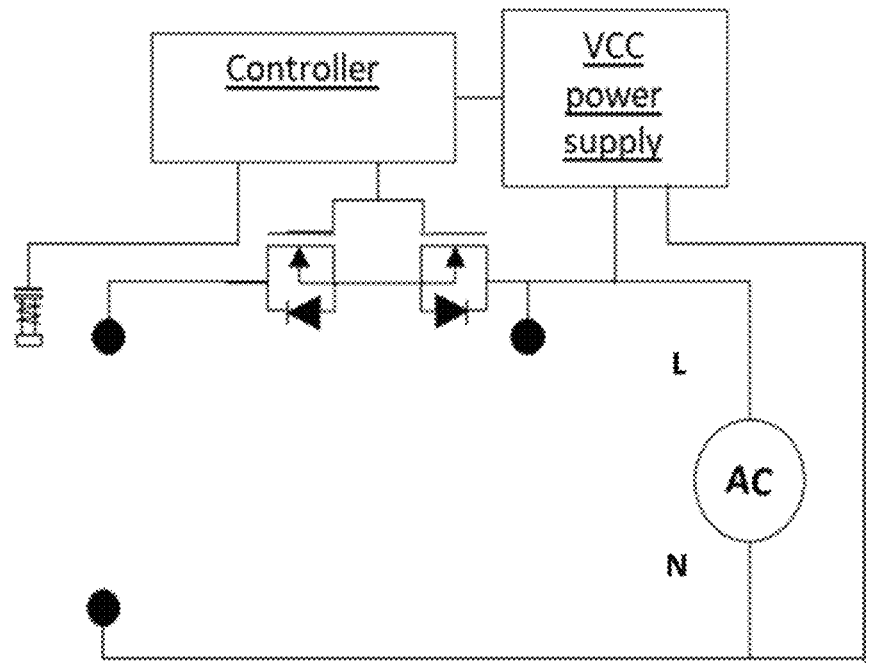

The control and power circuit of FIG. 7B is applicable to the power connector device 10, 110 when utilizing a single-phase AC, single pole power supply. In this case, the semiconductor switch has back-to-back common collector semiconductor switches to handle respective half cycles of the AC voltage signal.

Figure 7C:
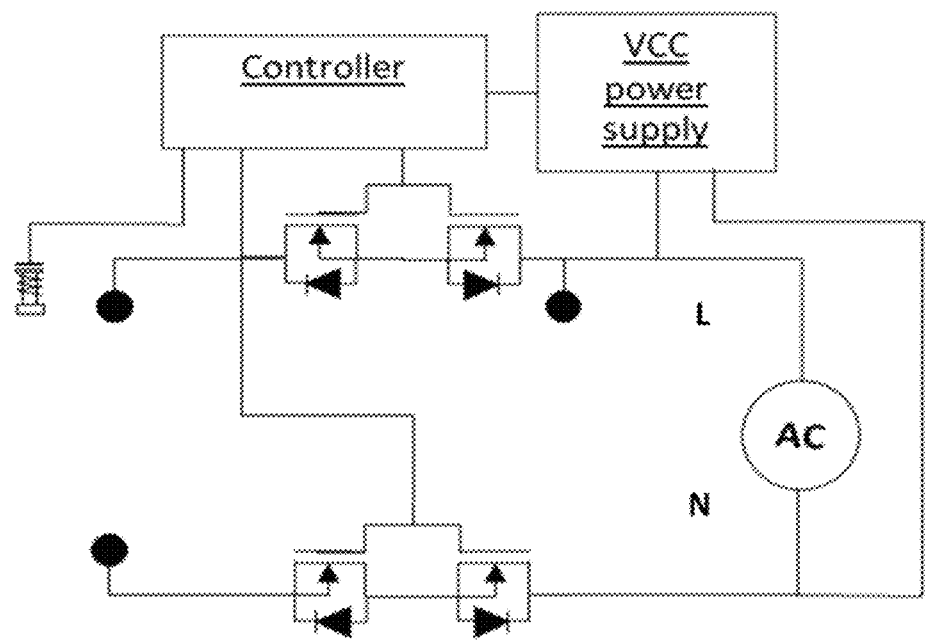

The control and power circuit of FIG. 7C is applicable to the power connector device 10, 110 when utilizing a single-phase AC, double pole power supply.

Figure 7D:
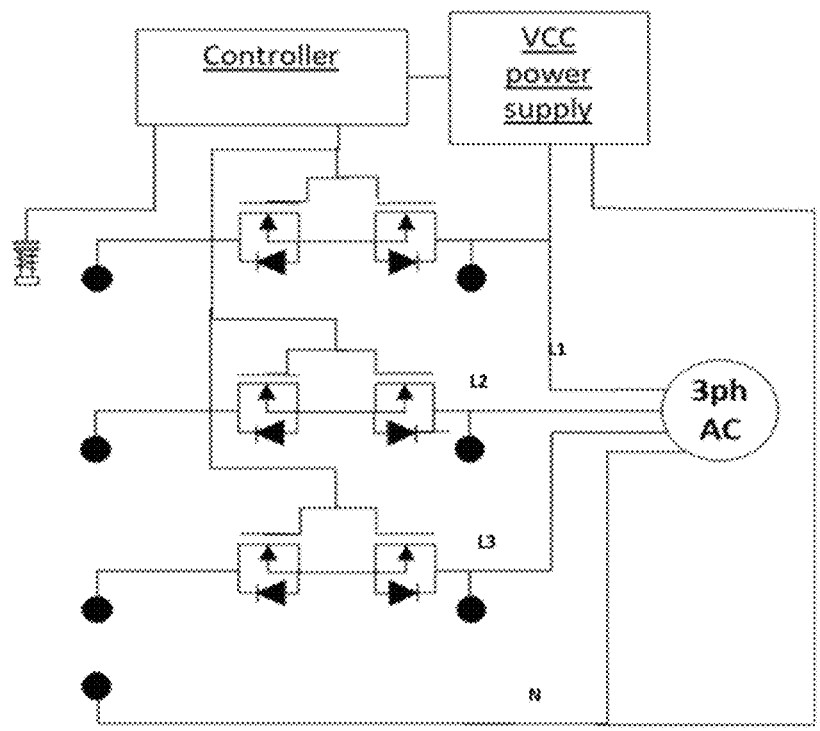

The control and power circuit of FIG. 7D is applicable to the power connector device 10, 110 when utilizing a three-phase AC multi-pole power supply.

Figure 7E:
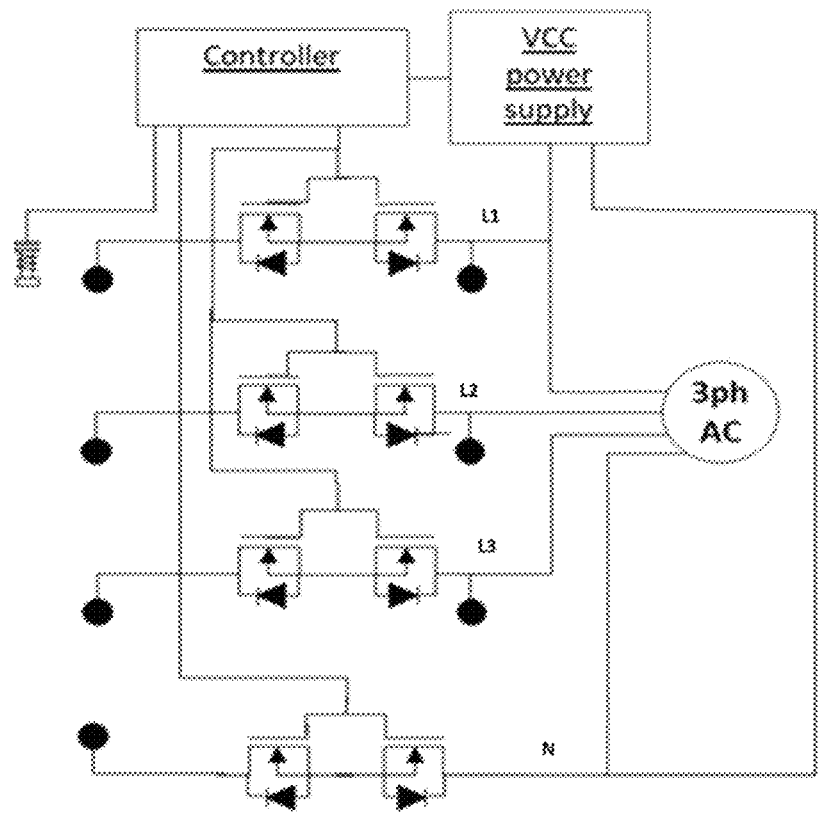

The control and power circuit of FIG. 7E is an alternative control and power circuit to that of FIG. 7D for the power connector device 10, 110 when utilizing a three-phase AC multi-pole power supply.

Referring again to the second embodiment of the invention depicted by FIG. 3, FIG. 4 provides a block diagram of the control and power circuit 76 for the power connector device 50 of FIG. 3. The control and power circuit 76 of FIG. 4 is also applicable to the power connector device 150 of the fourth embodiment of the invention depicted by FIGS. 6A-D. FIGS. 8A-E provide alternative control and power circuits to that of FIG. 4 for the power connector device 50 of the second embodiment and the power connector device 150 of the fourth embodiment.

Figure 8A:
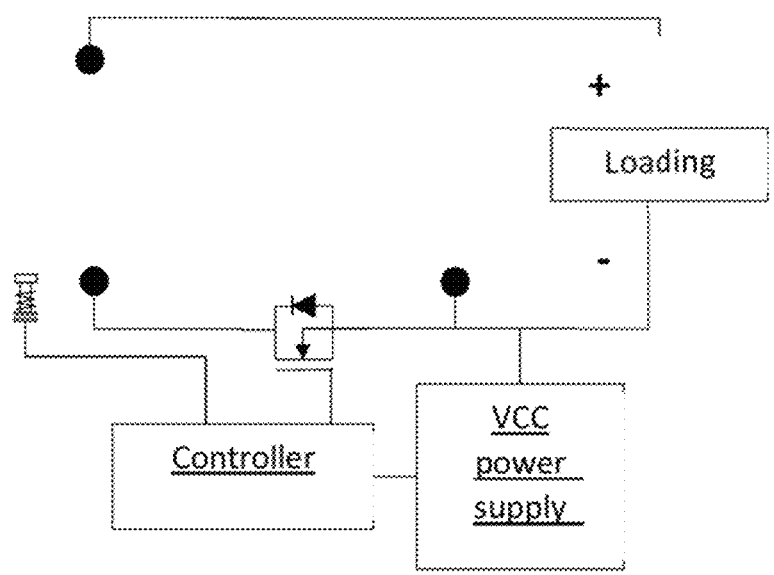
FIGS. 8A-E are alternative control and power circuits to that of FIG. 4 for the power connector device of the second and fourth embodiments of FIGS. 3 and 6A-D.

The control and power circuit of FIG. 8A is applicable to the power connector device 50, 150 still utilizing a DC power supply but for another pole line of said DC power supply. As such, the control and power circuit of FIG. 8A is to some degree a mirror image of the control and power circuit 76 of FIG. 4.

Figure 8B:
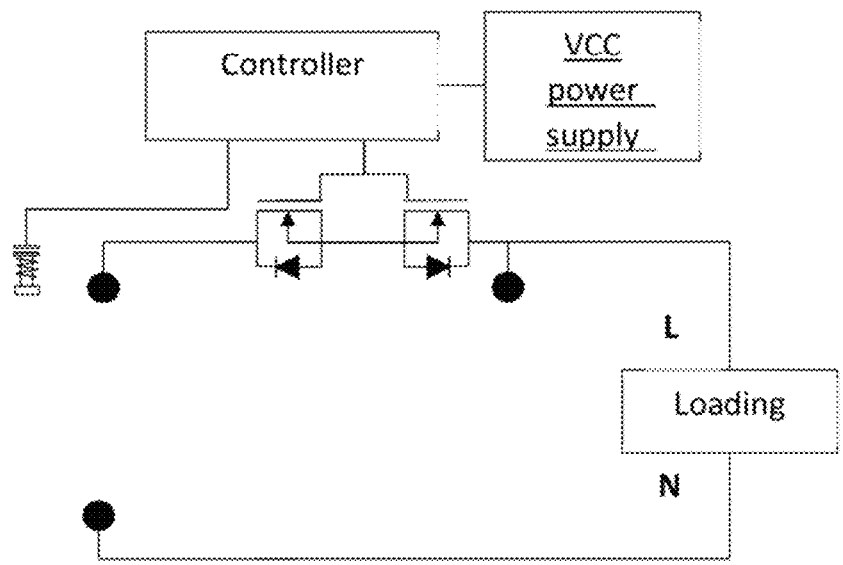

The control and power circuit of FIG. 8B is applicable to the power connector device 50, 150 when utilizing a single-phase AC, single pole power supply. In this case, the semiconductor switch has back-to-back common collector semiconductor switches to handle respective half cycles of the AC voltage signal.

Figure 8C:
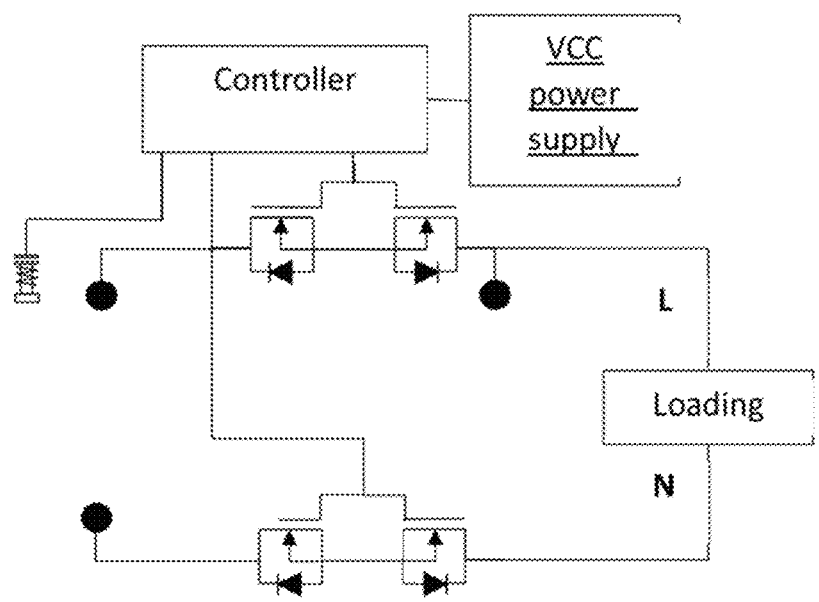

The control and power circuit of FIG. 8C is applicable to the power connector device 50, 150 when utilizing a single-phase AC, double pole power supply.

Figure 8D:
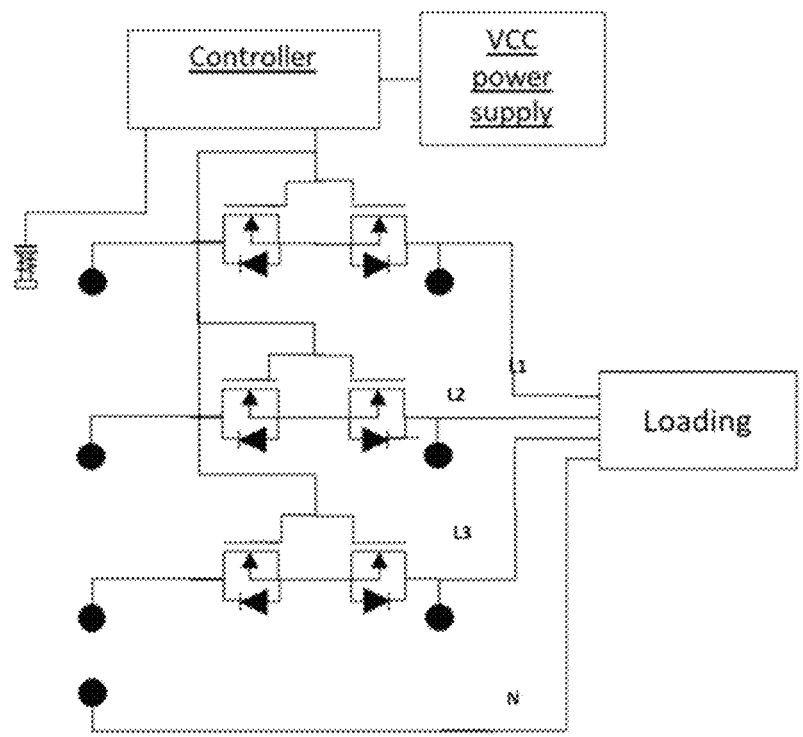

The control and power circuit of FIG. 8D is applicable to the power connector device 50, 150 when utilizing a three-phase AC multi-pole power supply.

Figure 8E:
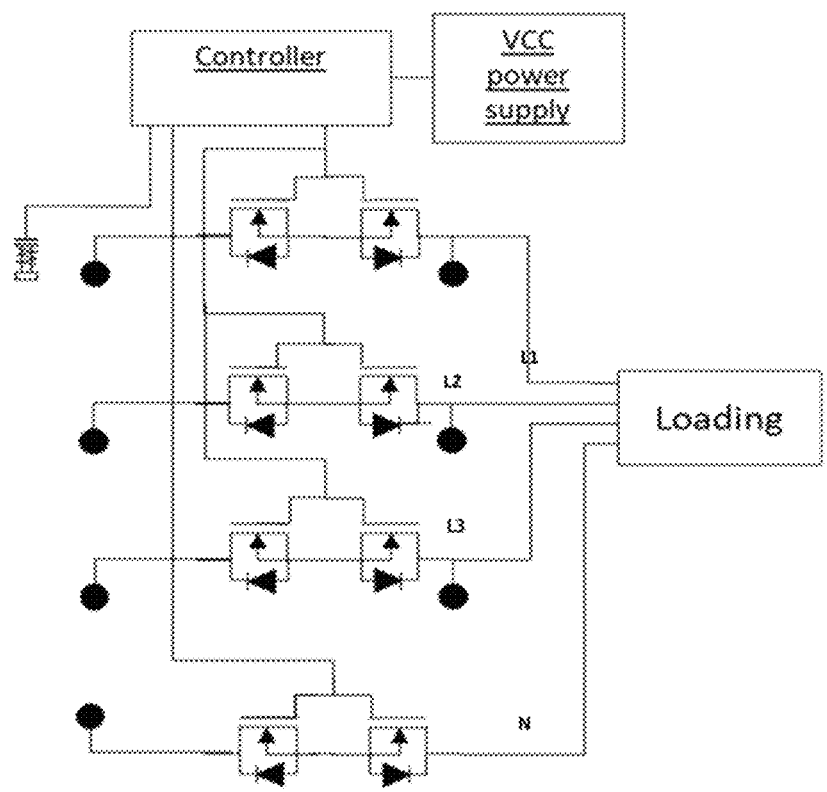

The control and power circuit of FIG. 8E is an alternative control and power circuit to that of FIG. 8D for the power connector device 50,150 when utilizing a three-phase AC multi-pole power supply.

The apparatus described above may be implemented at least in part in software. Those skilled in the art will appreciate that the apparatus described above may be implemented at least in part using general purpose computer equipment or using bespoke equipment.

While the invention has been illustrated and described in detail in the drawings and foregoing description, the same is to be considered as illustrative and not restrictive in character, it being understood that only exemplary embodiments have been shown and described and do not limit the scope of the invention in any manner. It can be appreciated that any of the features described herein may be used with any embodiment. The illustrative embodiments are not exclusive of each other or of other embodiments not recited herein. Accordingly, the invention also provides embodiments that comprise combinations of one or more of the illustrative embodiments described above. Modifications and variations of the invention as herein set forth can be made without departing from the spirit and scope thereof, and, therefore, only such limitations should be imposed as are indicated by the appended claims.

In the claims which follow and in the preceding description of the invention, except where the context requires otherwise due to express language or necessary implication, the word "comprise" or variations such as "comprises" or "comprising" is used in an inclusive sense, i.e., to specify the presence of the stated features but not to preclude the presence or addition of further features in various embodiments of the invention.

It is to be understood that, if any prior art publication is referred to herein, such reference does not constitute an admission that the publication forms a part of the common general knowledge in the art.

The invention claimed is:

1. A power connector device for separating an electrical connection under direct current (DC) voltage or alternating current (AC) voltage between an electrical connector element and an electrical contact element, said electrical contact element having a first conductive part spaced apart from a second conductive part; and a semiconductor switch for maintaining an electrical connection between said electrical connector element and said electrical contact element during separation of contact between the electrical connector element and the first conductive part of the electrical contact element to thereby prevent arcing during electrical disengagement of the electrical connector element from the electrical contact element; wherein the first conductive part of the electrical contact element is only electrically connected to the second conductive part of the electrical contact element when the semiconductor switch is activated or when the electrical connector element is in contact with both the first and second conductive parts of the electrical contact element.

2. The power connector device of claim 1, wherein the power connector device includes a trigger device for de-activating the semiconductor switch after the electrical connector element has come out of contact with the first conductive part of the electrical contact element.

3. The power connector device of claim 2, wherein the trigger device de-activates the semiconductor switch after the electrical connector element has come out of contact with the first conductive part of the electrical contact element but before the electrical connector element has come out of contact with the second conductive part of the electrical contact element.

4. The power connector device of claim 2, wherein the semiconductor switch is controlled by a controller in response to an input from the trigger device.

5. The power connector device of claim 4, wherein, when the controller determines that there is a separation action based on the trigger device input, the controller deactivates the semiconductor switch to turn off a semiconductor switch path between the first conductive part and the second conductive part of the electrical contact element when the separation action continues to a point where the electrical connector element has come out of contact with at least the first conductive part of the electrical contact element.

6. The power connector device of claim 4, wherein the trigger device activates the semiconductor switch when the electrical connector element is brought into contact with the electrical contact element.

7. The power connector device of claim 4, wherein the trigger device activates the semiconductor switch when the electrical connector element is first brought into contact with the second conductive part of the electrical contact element.

8. The power connector device of claim 4, wherein the semiconductor switch comprises a single active switch path for preventing arcing during electrical disengagement of the electrical connector element from the electrical contact element.

9. The power connector device of claim 4, wherein the semiconductor switch comprises a single switching path bridging said first conductive part and said second conductive part of the electrical contact element.

10. The power connector device of claim 4, wherein the semiconductor switch is a difference type semiconductor switch.

11. The power connector device of claim 5, wherein a body diode of the semiconductor switch is connected in parallel with the semiconductor switch path.

12. The power connector device of claim 2, wherein the trigger device comprises any of: a mechanically actuated trigger device; an optically actuated trigger device; a magnetically actuated trigger device, or a position sensor.

13. The power connector device of claim 4, wherein the trigger device comprises a mechanically actuated trigger device which deactivates the semiconductor switch when a trigger member of the trigger device is released.

14. The power connector device of claim 1, wherein respective electrical contact surfaces of the first conductive part and the second conductive part are spaced apart in a separation direction of the electrical connector element from the electrical contact element.

15. The power connector device of claim 1, wherein the electric connector element comprises an electrically conductive pin of an electric plug and the electrical contact element comprises an electrically conductive slot of an electric socket having a first conductive part and a second conductive part spaced apart one from the other.

16. The power connector device of claim 1, wherein the electric connector element comprises an electrically conductive slot of an electric socket and the electrical contact element comprises an electrically conductive pin of an electric plug having a first conductive part and a second conductive part spaced apart one from the other.

17. The power connector device of claim 16, wherein the first conductive part of the electrical contact element comprising the electrically conductive pin is arranged concentrically with the second conductive part but separated by an electrical insulator.

18. The power connector device of claim 16, wherein the power connector device comprises a plug and wherein the plug has no more than two electrically conductive pins, one of said two electrically conductive pins comprising the electrically conductive pin having the first conductive part and the second conductive part spaced apart one from the other and the remaining one of said two electrically conductive pins comprising a conventional electrically conductive plug power return or neutral pin.

19. An electrical socket configured for separating an electrical connection under direct current (DC) voltage or alternating current (AC) voltage between an electrically conductive pin and an electrically conductive slot, said electrical socket comprising:

said electrically conductive slot which is adapted to receive said electrically conductive pin, said electrically conductive slot having a first conductive part and a second conductive part spaced apart one from the other;

a semiconductor switch for maintaining an electrical connection between said electrically conductive pin and said electrically conductive slot during separation of contact between the electrically conductive pin and the first conductive part; and a trigger device for de-activating the semiconductor switch after the electrically conductive pin has come out of contact with the first conductive part to thereby prevent arcing during electrical disengagement of the electrically conductive pin from the electrically conductive slot;

wherein the first conductive part of the electrically conductive slot is only electrically connected to the second conductive part of the electrically conductive slot when the semiconductor switch is activated or when the electrically conductive pin is in contact with both the first and second conductive parts of the electrically conductive slot.

20. An electrical plug for separating an electrical connection under direct current (DC) voltage or alternating current (AC) voltage between an electrically conductive pin and an electrically conductive slot, said electrical plug comprising:

said electrically conductive pin which is adapted to be received in said electrically conductive slot, said electrically conductive pin having a first conductive part and a second conductive part spaced apart one from the other;

a semiconductor switch for maintaining an electrical connection between said electrically conductive slot and said electrically conductive pin during separation of contact between the electrically conductive slot and the first conductive part; and a trigger device for de-activating the semiconductor switch after the electrically conductive slot has come out of contact with the first conductive part to thereby prevent arcing during electrical disengagement of the electrically conductive slot from the electrically conductive pin;

wherein the first conductive part of the electrically conductive pin is only electrically connected to the second conductive part of the electrically conductive pin when the semiconductor switch is activated or when the electrically conductive slot is in contact with both the first and second conductive parts of the electrically conductive pin.

\* \* \* \* \*